United States Patent
Choi et al.

(10) Patent No.: US 8,063,475 B2
(45) Date of Patent: Nov. 22, 2011

(54) SEMICONDUCTOR PACKAGE SYSTEM WITH THROUGH SILICON VIA INTERPOSER

(75) Inventors: DaeSik Choi, Seoul (KR); DeokKyung Yang, Hanam-si (KR); Seung Won Kim, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 413 days.

(21) Appl. No.: 12/239,715

(22) Filed: Sep. 26, 2008

(65) Prior Publication Data

US 2010/0078789 A1 Apr. 1, 2010

(51) Int. Cl.
*H01L 23/02* (2006.01)

(52) U.S. Cl. .............. 257/686; 257/621; 257/E23.023; 257/E21.511

(58) Field of Classification Search .......... 257/621, 257/686, E23.023, E21.511
See application file for complete search history.

(56) References Cited

U.S. PATENT DOCUMENTS

| | | | |
|---|---|---|---|
| 6,958,544 B2 * | 10/2005 | Sunohara | 257/758 |
| 6,962,867 B2 | 11/2005 | Jackson et al. | |
| 7,288,835 B2 | 10/2007 | Yim et al. | |
| 7,307,003 B2 | 12/2007 | Reif et al. | |
| 7,368,319 B2 | 5/2008 | Ha et al. | |
| 7,372,141 B2 | 5/2008 | Karnezos et al. | |
| 7,384,819 B2 | 6/2008 | Yip et al. | |
| 7,385,299 B2 | 6/2008 | Chow et al. | |
| 7,390,700 B2 | 6/2008 | Gerber et al. | |
| 7,394,148 B2 | 7/2008 | Karnezos | |
| 7,397,132 B2 | 7/2008 | Suzuya | |
| 7,402,515 B2 | 7/2008 | Arana et al. | |
| 2005/0199929 A1 * | 9/2005 | Horikawa et al. | 257/296 |
| 2006/0063312 A1 * | 3/2006 | Kurita | 438/127 |
| 2006/0108666 A1 * | 5/2006 | Koizumi | 257/621 |
| 2007/0278696 A1 | 12/2007 | Lu et al. | |

* cited by examiner

*Primary Examiner* — Tan N Tran
(74) *Attorney, Agent, or Firm* — Mikio Ishimaru

(57) ABSTRACT

A semiconductor package system includes: providing a top package, a through silicon via interposer embedded in the top package; providing a bottom package having a bottom semiconductor die with a top connection adjacent the center active face thereof, a substrate interposer being embedded in the bottom package, the bottom semiconductor die being attached to the substrate interposer; and attaching the top package to the bottom package, the top package having the through silicon via interposer having a via connected to the top connection.

18 Claims, 11 Drawing Sheets

SEMICONDUCTOR PACKAGE SYSTEM WITH THROUGH SILICON VIA INTERPOSER

TECHNICAL FIELD

The present invention relates generally to semiconductor packages, and more particularly to a system for a semiconductor package for a smaller and thinner stacked solution.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Typically, the packages on which these integrated semiconductor chips are mounted include a substrate or other chip-mounting device. Substrates are parts that provide the package with mechanical base support and a form of electrical interface that would allow the external world to access the device housed within the package. When multiple chips are mounted within the same semiconductor package, routing problems may arise due to the different routing design of each individual chip. To solve this problem, an interposer is often used. An interposer is an electrical interface routing between one socket or connection to another. It is an intermediate layer often used for interconnection routing or as a ground/power plane. Sometimes the terms 'substrate' and 'interposer' are used to refer to the same thing.

A 3D integrated circuit (3D IC) is a single integrated circuit built by stacking silicon wafers and/or dies and interconnecting them vertically so that they behave as a single device. A 3D package contains two or more chips (integrated circuits) stacked vertically so that they occupy less space. Each such chip in such a 3D package could be a conventional chip, a flip chip, or other chips. Conventionally, a single logic die is mounted on silicon using a ball grid array (BGA) package. However, if additional functionality is required, such as flash added to the package stack, 3D IC is needed. Sometimes substrate interposer is used to address the routing problems in 3D IC.

A Package-on-Package (PoP) package is a 3D package in which fully tested packages are stacked on top of one another during the board mount process. A PoP package usually consists of a bottom package and a top package. The bottom package is typically an ASIC or baseband device and the top package may be other functional device such as memory. However, in most 3D packages, the stacked chips are connected together along their edges. And it usually requires extra interposer layers. A laminated substrate is often used for this purpose. Typically both the bottom package and the top package have a laminated substrate. The bottom package has land pads placed on the periphery of the laminated substrate to accommodate the solder balls placed on the periphery of the laminated substrate of the top package. This edge connection on laminated substrate, however, increases the length and width of the package and thus decreases the device density of the package. The current laminated substrate has limited pitch capability.

Typically the laminated substrate can only accommodate semiconductor chips that are not designed for 3D interconnections. Increasingly the semiconductor chips are designed for 3D interconnections. In the front-end-of-line (FEOL) process of semiconductor manufacturing, deep tungsten plugs are routinely fabricated and could serve as via metal interconnecting to other dies. Back-end-of-line (BEOL) process may also be designed for 3D interconnections. In these new technology developments, laminated substrate proves to be inadequate for the modern need of semiconductor 3D interconnections.

Thus, a need still remains for accommodating the modern trend of 3D interconnection design in semiconductor packaging, reducing the package footprint, thickness, and increasing the packaging density. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a semiconductor package system including: providing a top package, a through silicon via interposer embedded in the top package; providing a bottom package having a bottom semiconductor die with a top connection adjacent the center active face thereof, a substrate interposer being embedded in the bottom package, the bottom semiconductor die being attached to the substrate interposer; and attaching the top package to the bottom package, the top package having the through silicon via interposer having a via connected to the top connection.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
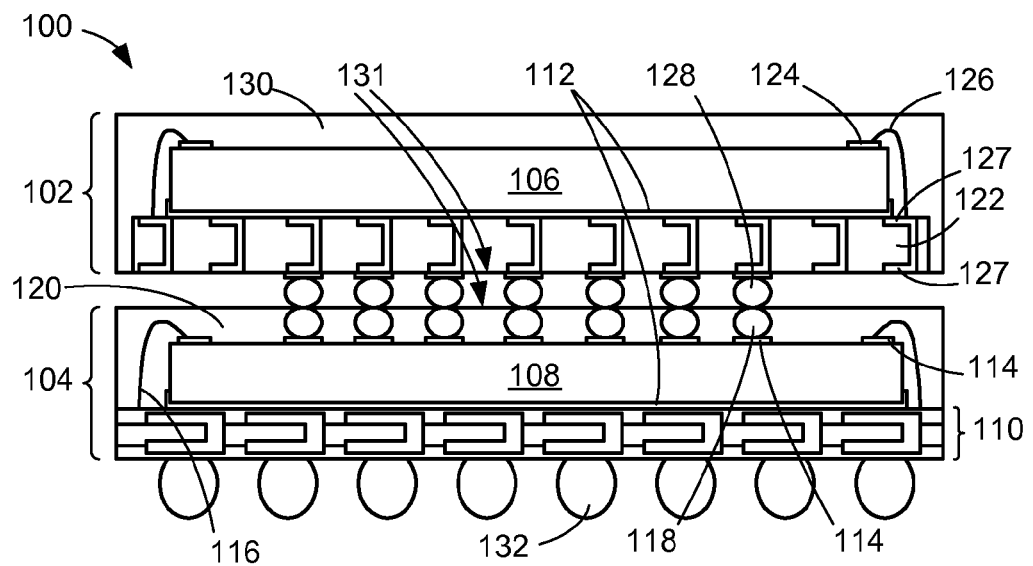
FIG. 1 is a cross-sectional view of a semiconductor package system along line 1-1 of FIG. 2 after a stage of singulation.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. Likewise, the drawings showing embodiments of the system are semi-diagrammatic and not to scale and, particularly, some of the dimensions are for the clarity of presentation and are shown exaggerated in the drawings. Also, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the semiconductor substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "system" as used herein refers to and is defined as the method and as the apparatus of the present invention in accordance with the context in which the term is used.

Figure 2:
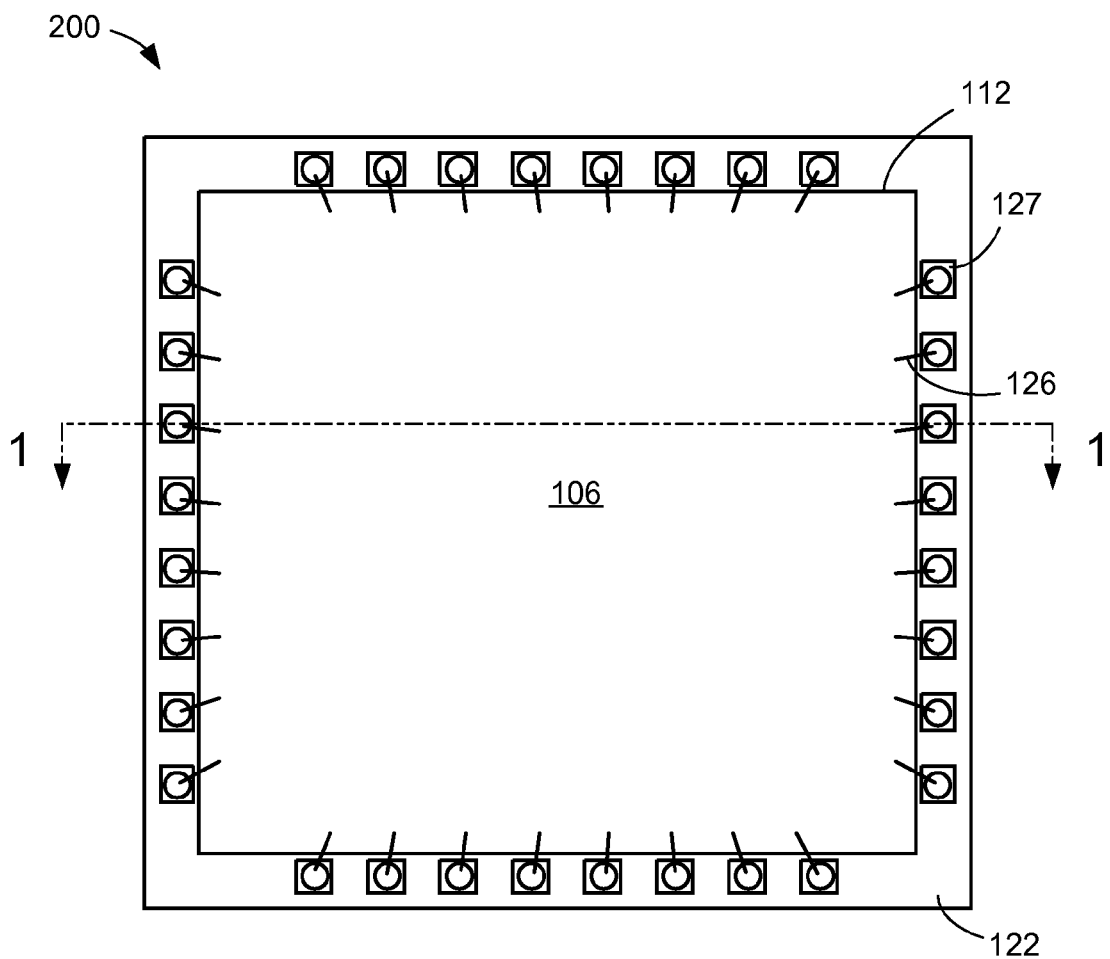
FIG. 2 is a top view of an unfinished semiconductor package of a first embodiment of the present invention after an intermediate stage of the process.

Referring now to FIG. 1, therein is shown a cross-sectional view of a semiconductor package system along line 1-1 of FIG. 2 after a stage of singulation. A finished semiconductor package 100 is shown. The finished semiconductor package 100 is a Package-on-Package package (PoP). The semiconductor package 100 has a top package 102 and a bottom package 104. A top semiconductor die 106 is embedded in the top package 102. A bottom semiconductor die 108 is embedded in the bottom package 104.

The bottom semiconductor die 108 is attached to a substrate interposer 110 through a die paste layer 112. The substrate interposer may be a laminated substrate. A bottom bonding pad 114 is shown on the bottom semiconductor die 108. The bottom bonding pad 114 is present on both the active center face as well as the periphery of the bottom semiconductor die 108. One bottom bonding pad 114 is attached to one end of a bottom bonding wire 116. The other end of the bottom bonding wire 116 is attached to the substrate interposer 110. A bottom on-chip solder ball 118 is attached to one bottom bonding pad 114 that is on or near the active center face of the bottom semiconductor die 108. The bottom semiconductor die 108, the bottom bonding wire 116, the bottom bonding pad 114, the die paste layer 112, and the whole or a portion of the bottom on-chip solder ball 118 are encapsulated by a bottom die mold 120.

The top semiconductor die 106 is attached to a through silicon via interposer 122 through the die paste layer 112.

The through silicon via interposer 122 is a silicon wafer or die that has electrical metal traces on one or both sides connected by conductive metal vias through the silicon.

It has been discovered that a conductive metal via may be placed at the center of the through silicon via interposer 122 as well as at the edges, and it has been found that by using the through silicon via interposer 122, the package size may be decreased without increasing the thickness and the packing density increased, resulting in packing a greater amount of functionality into a smaller size.

In addition, critical electrical paths through the through silicon via interposer 122 can be drastically shortened, leading to faster operation, higher data transmission bandwidth, less heating, lower power consumption, and significant performance enhancement.

A top bonding pad 124 is shown on the top semiconductor die 106. The top bonding pad 124 is attached to one end of a top bonding wire 126. The other end of the top bonding wire 126 is attached to a through silicon via interposer pad 127 on the through silicon via interposer 122.

The through silicon via interposer pad 127 is at both the top and the bottom surface of the through silicon via interposer 122. The through silicon via interposer pad 127 is at both the center and the peripheral surfaces of the through silicon via interposer 122.

A top on-chip solder ball 128 is attached to one through silicon via interposer pad 127 at or near the center of the bottom surface of the through silicon via interposer 122. The top semiconductor die 106, the top bonding wire 126, the top bonding pad 124, the die paste layer 112, and the through silicon via interposer 122 are encapsulated by a top die mold 130.

The top on-chip solder ball 128 is in contact with the bottom on-chip solder ball 118. In this way, the top package 102 and the bottom package 104 is connected through a center active face 131 respective of the top package 102 and the bottom package 104, rather through the peripheries, resulting in denser packaging.

A package solder ball 132 is attached to the bottom of the substrate interposer 110 of the bottom package 104. The top die mold 130 and the bottom die mold 120 could be made out of organic materials.

Referring now to FIG. 2, therein is shown a top view of an unfinished semiconductor package 200 of the first embodiment of the present invention after an intermediate stage of the process. This top view is shown after the top die mold 130 in FIG. 1 has been removed. The top semiconductor die 106 is shown and the die paste layer 112 is also shown. The through silicon via interposer pad 127 is shown together with the through silicon via interposer 122.

Figure 3:
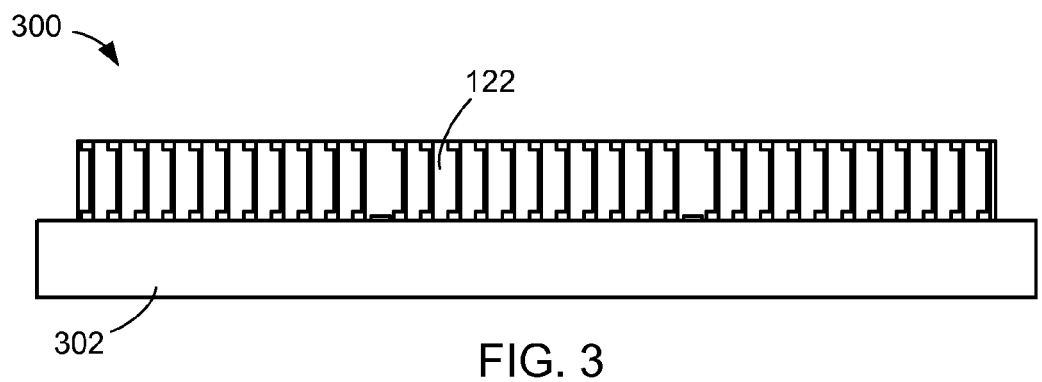
FIG. 3 is a cross-sectional view similar to FIG. 1 of an unfinished semiconductor package of the first embodiment of the present invention after a first intermediate stage of the process.

Referring now to FIG. 3, therein is shown a cross-sectional view similar to FIG. 1 of an unfinished semiconductor package 300 of the first embodiment of the present invention after a first intermediate stage of the process. The through silicon via interposer 122 is attached to a bottom carrier 302.

The bottom carrier 302 is typically made out of plastic tape material and could typically be stretched or extended horizontally.

Figure 4:
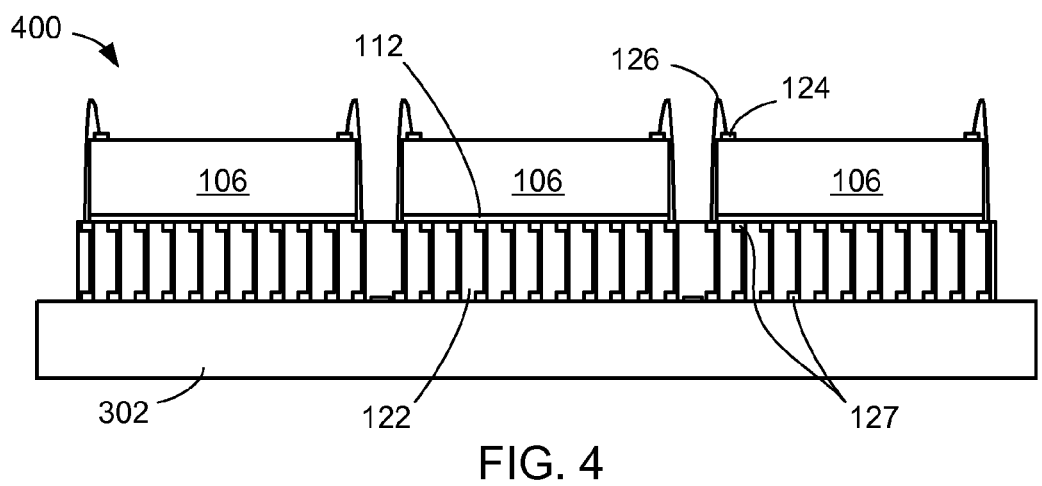
FIG. 4 is a cross-sectional view similar to FIG. 1 of an unfinished semiconductor package of the first embodiment of the present invention after a second intermediate stage of the process.

Referring now to FIG. 4, therein is shown a cross-sectional view similar to FIG. 1 of an unfinished semiconductor package 400 of the first embodiment of the present invention after a second intermediate stage of the process.

The top semiconductor die 106 is attached to the through silicon via interposer 122 through the die paste layer 112. The top bonding pad 124 is shown on the top semiconductor die 106. The top bonding pad 124 is attached to one end of the top bonding wire 126. The other end of the top bonding wire 126 is attached to the through silicon via interposer pad 127 on the through silicon via interposer 122.

Figure 5:
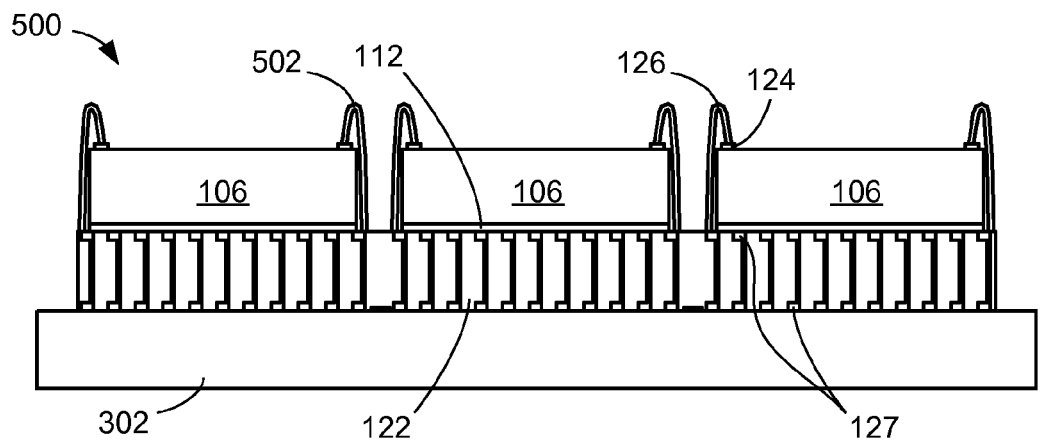
FIG. 5 is a cross-sectional view similar to FIG. 1 of an unfinished semiconductor package of the first embodiment of the present invention after a third intermediate stage of the process.

Referring now to FIG. 5, therein is shown a cross-sectional view similar to FIG. 1 of an unfinished semiconductor package 500 of the first embodiment of the present invention after a third intermediate stage of the process. A wire lock layer 502 is attached to and wrapped around the top bonding wire 126.

Figure 6:
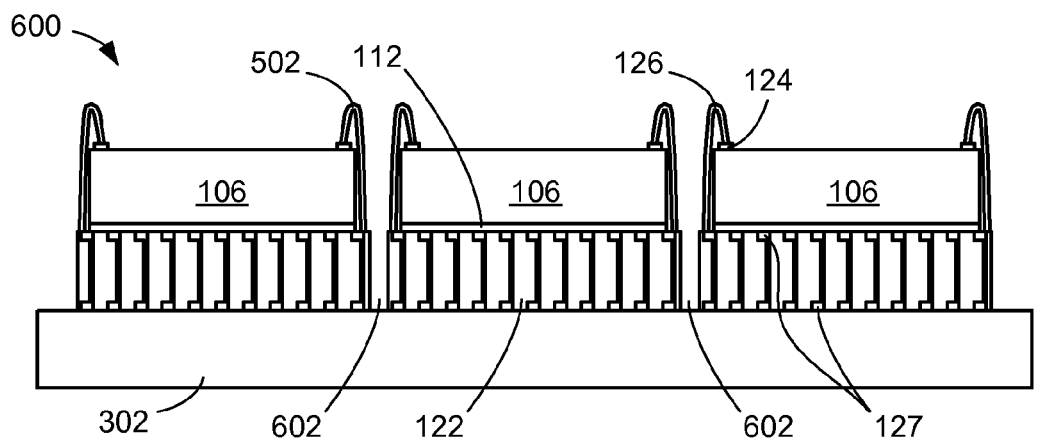
FIG. 6 is a cross-sectional view similar to FIG. 1 of an unfinished semiconductor package of the first embodiment of the present invention after a fourth intermediate stage of the process.

Referring now to FIG. 6, therein is shown a cross-sectional view similar to FIG. 1 of an unfinished semiconductor package 600 of the first embodiment of the present invention after a fourth intermediate stage of the process. A top groove 602 is cut through the through silicon via interposer 122.

The purpose of the wire lock layer 502 attached earlier is to protect the top bonding wire 126 during the cutting of the top groove 602.

Figure 7:
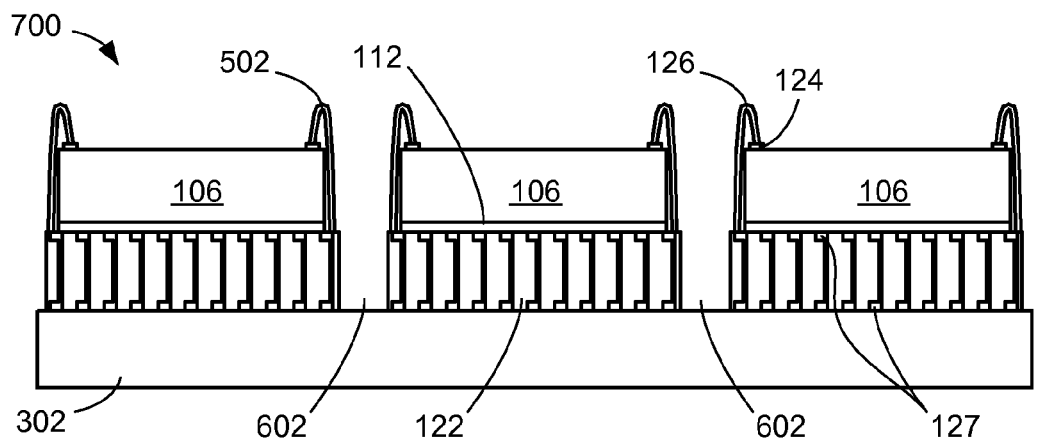
FIG. 7 is a cross-sectional view similar to FIG. 1 of an unfinished semiconductor package of the first embodiment of the present invention after a fifth intermediate stage of the process.

Referring now to FIG. 7, therein is shown a cross-sectional view similar to FIG. 1 of an unfinished semiconductor package 700 of the first embodiment of the present invention after a fifth intermediate stage of the process. The bottom carrier 302 is stretched and extended horizontally so that the top groove 602 is also widened.

Figure 8:
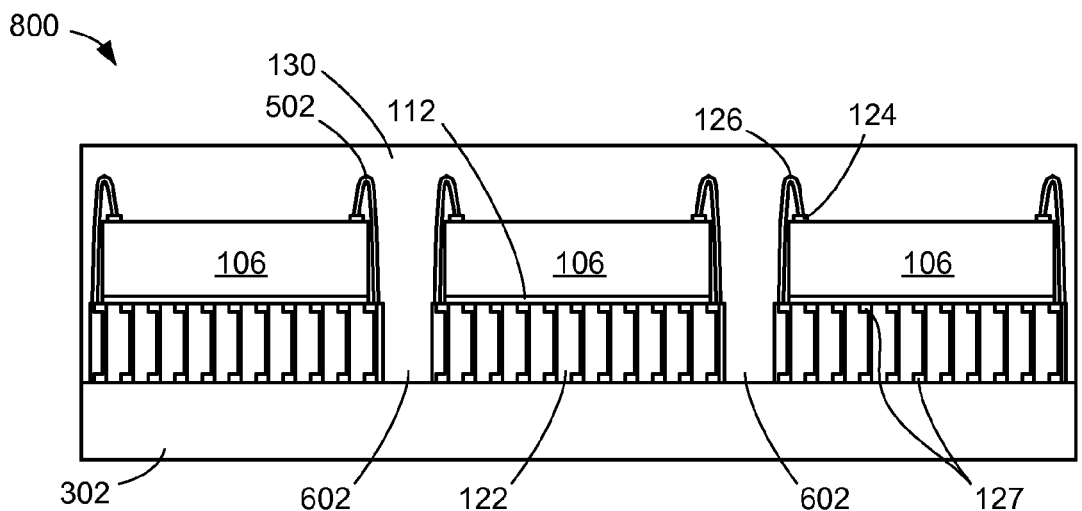
FIG. 8 is a cross-sectional view similar to FIG. 1 of an unfinished semiconductor package of the first embodiment of the present invention after a sixth intermediate stage of the process.

Referring now to FIG. 8, therein is shown a cross-sectional view similar to FIG. 1 of an unfinished semiconductor package 800 of the first embodiment of the present invention after a sixth intermediate stage of the process. The top semiconductor die 106, the through silicon via interposer 122, the top bonding wire 126, the top bonding pad 124, the wire lock layer 502, and the die paste layer 112 are encapsulated by the top die mold 130. The top groove 602 is also filled with the top die mold 130.

Figure 9:
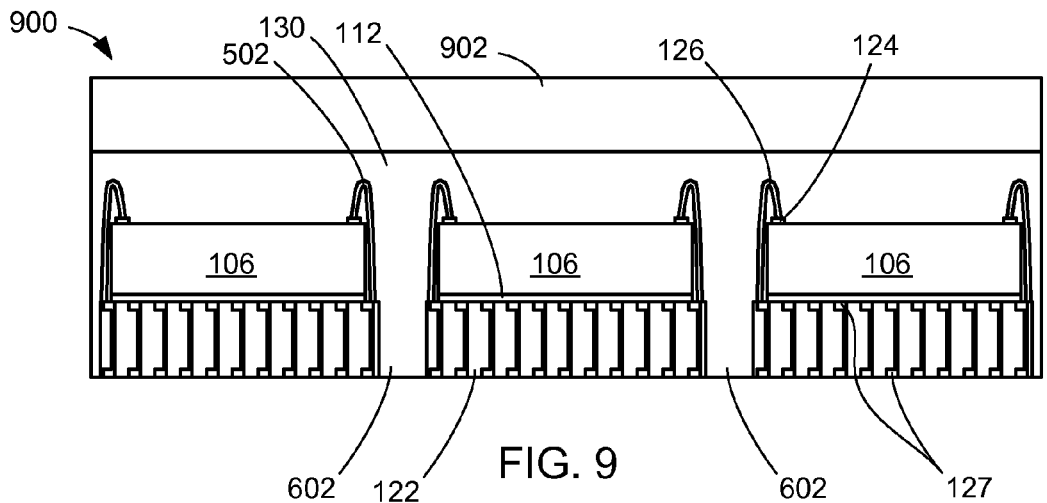
FIG. 9 is a cross-sectional view similar to FIG. 1 of an unfinished semiconductor package of the first embodiment of the present invention after a seventh intermediate stage of the process.

Referring now to FIG. 9, therein is shown a cross-sectional view similar to FIG. 1 of an unfinished semiconductor package 900 of the first embodiment of the present invention after a seventh intermediate stage of the process. The bottom carrier 302 is removed. A top carrier 902 is attached to the top of the top die mold 130.

Figure 10:
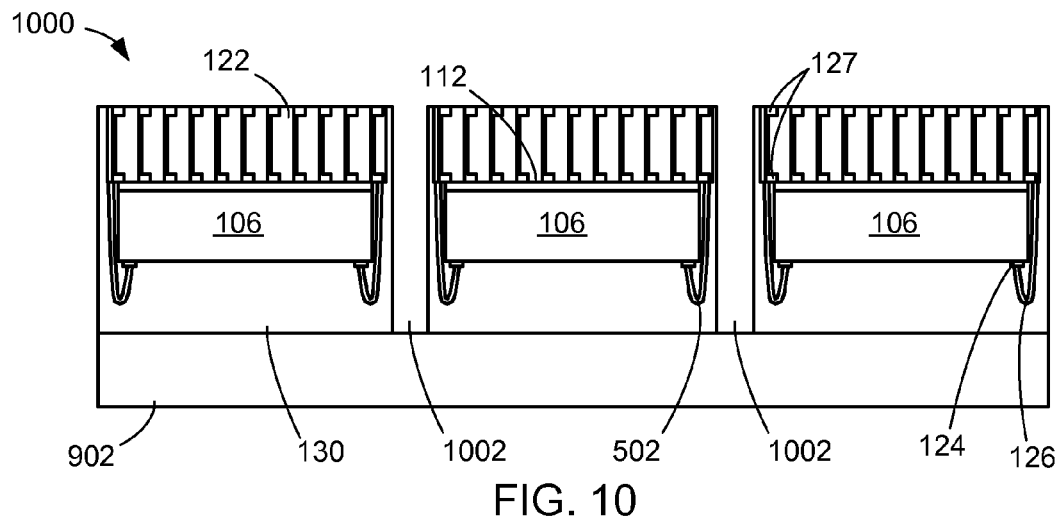
FIG. 10 is a cross-sectional view similar to FIG. 1 of an unfinished semiconductor package of the first embodiment of the present invention after an eighth intermediate stage of the process.

Referring now to FIG. 10, therein is shown a cross-sectional view similar to FIG. 1 of an unfinished semiconductor package 1000 of the first embodiment of the present invention after an eighth intermediate stage of the process. The unfinished semiconductor package 900 in FIG. 9 is singulated and a top gap 1002 is formed. The FIG. 10 is in an upside down view compared to FIG. 9.

Referring now to FIG. 1, therein is shown a cross-sectional view similar to FIG. 1 of an unfinished semiconductor package 1100 of the first embodiment of the present invention after a ninth intermediate stage of the process. The top carrier 902 is removed. The top on-chip solder ball 128 is attached to the through silicon via interposer pad 127 at the bottom of the through silicon via interposer 122. The top package 102 is formed.

Figure 12:
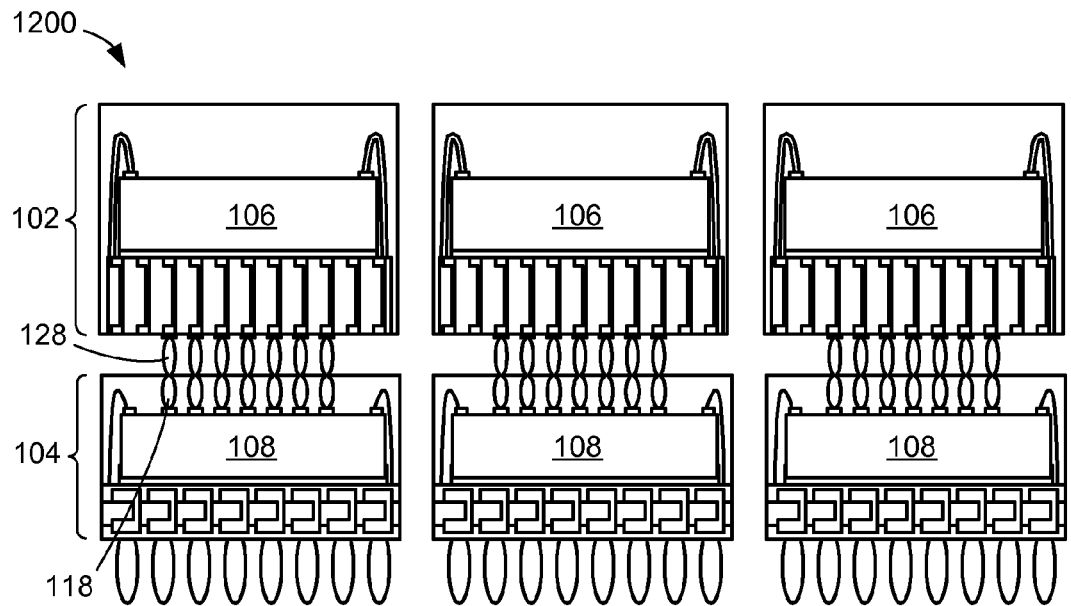
FIG. 12 is a cross-sectional view similar to FIG. 1 of a finished semiconductor package of the first embodiment of the present invention after a tenth intermediate stage of the process.

Referring now to FIG. 12, therein is shown a cross-sectional view similar to FIG. 1 of a finished semiconductor package 1200 of the first embodiment of the present invention after a tenth intermediate stage of the process. The top package 102 is connected with the bottom package 104 through the contact between the top on-chip solder ball 128 and the bottom on-chip solder ball 118. The finished semiconductor package 1200 is formed.

Figure 13:
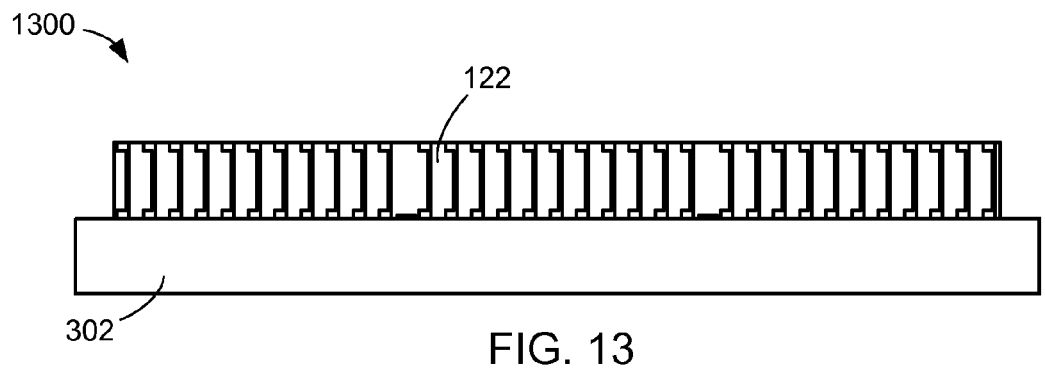
FIG. 13 is a cross-sectional view similar to FIG. 1 of an unfinished semiconductor package of the first embodiment of the present invention after a first alternative intermediate stage of the process.

Referring now to FIG. 13, therein is shown a cross-sectional view similar to FIG. 1 of an unfinished semiconductor package 1300 of the first embodiment of the present invention after a first alternative intermediate stage of the process. The through silicon via interposer 122 is attached to the bottom carrier 302.

The bottom carrier 302 is typically made out of plastic tape material and could typically be stretched or extended horizontally.

Figure 14:
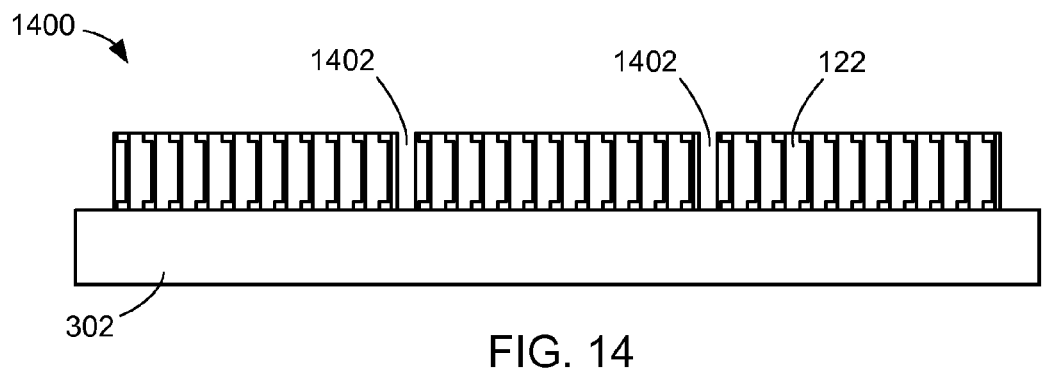
FIG. 14 is a cross-sectional view similar to FIG. 1 of an unfinished semiconductor package of the first embodiment of the present invention after a second alternative intermediate stage of the process.

Referring now to FIG. 14, therein is shown a cross-sectional view similar to FIG. 1 of an unfinished semiconductor package 1400 of the first embodiment of the present invention after a second alternative intermediate stage of the process. The through silicon via interposer 122 is cut and a through silicon via interposer groove 1402 is formed.

The forming of the through silicon via interposer groove 1402 could be through sawing of the through silicon via interposer 122.

Figure 15:
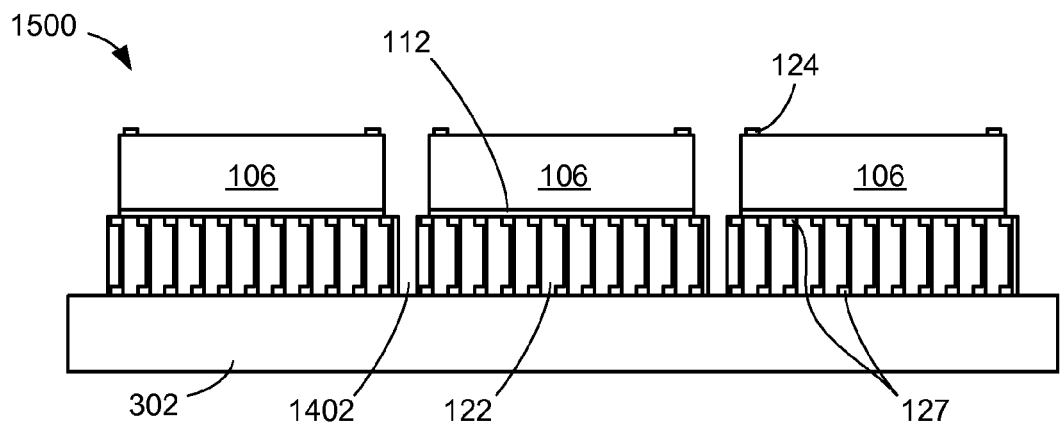
FIG. 15 is a cross-sectional view similar to FIG. 1 of an unfinished semiconductor package of the first embodiment of the present invention after a third alternative intermediate stage of the process.

Referring now to FIG. 15, therein is shown a cross-sectional view similar to FIG. 1 of an unfinished semiconductor package 1500 of the first embodiment of the present invention after a third alternative intermediate stage of the process. The top semiconductor die 106 is attached to the through silicon via interposer 122 through the die paste layer 112. The top bonding pad 124 is shown on the top semiconductor die 106.

Figure 16:
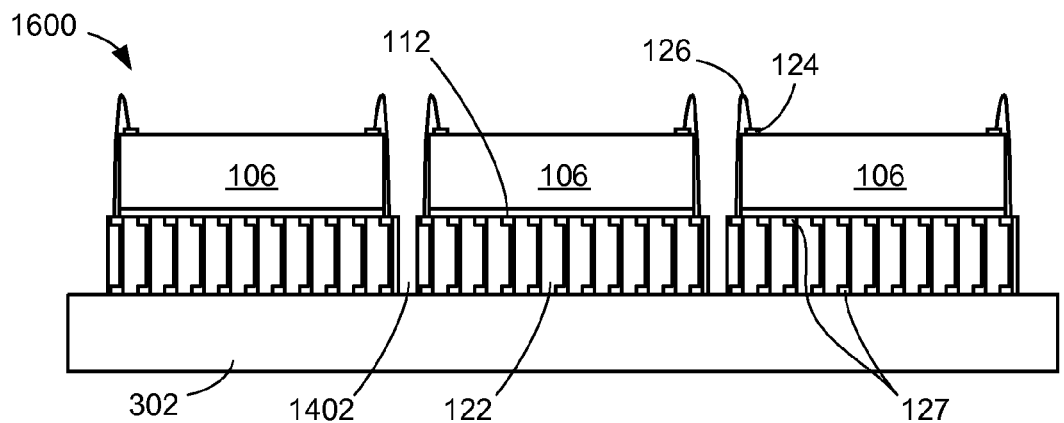
FIG. 16 is a cross-sectional view similar to FIG. 1 of an unfinished semiconductor package of the first embodiment of the present invention after a fourth alternative intermediate stage of the process.

Referring now to FIG. 16, therein is shown a cross-sectional view similar to FIG. 1 of an unfinished semiconductor package 1600 of the first embodiment of the present invention after a fourth alternative intermediate stage of the process. The top bonding pad 124 is attached to one end of the top bonding wire 126. The other end of the top bonding wire 126 is attached to the through silicon via interposer pad 127 on the through silicon via interposer 122.

Figure 17:
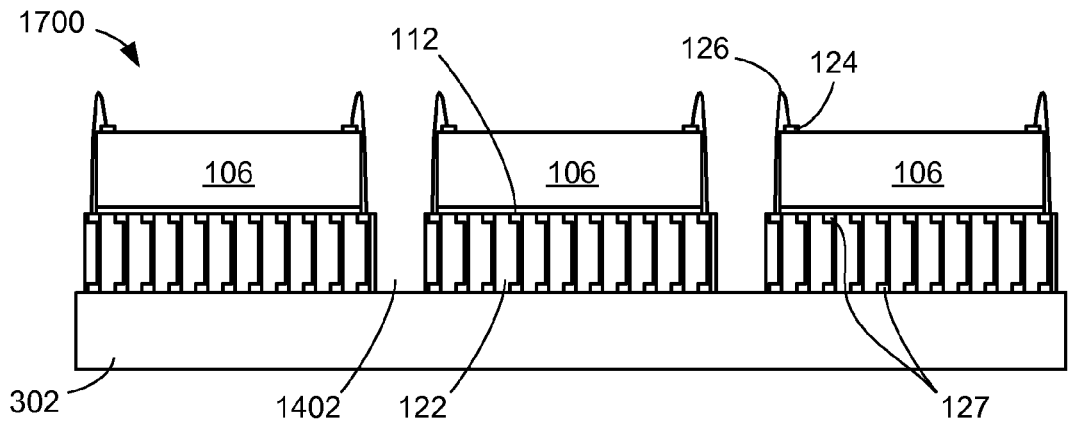
FIG. 17 is a cross-sectional view similar to FIG. 1 of an unfinished semiconductor package of the first embodiment of the present invention after a fifth alternative intermediate stage of the process.

Referring now to FIG. 17, therein is shown a cross-sectional view similar to FIG. 1 of an unfinished semiconductor package 1700 of the first embodiment of the present invention after a fifth alternative intermediate stage of the process. The bottom carrier 302 is stretched and extended horizontally so that the through silicon via interposer groove 1402 is also widened.

Figure 18:
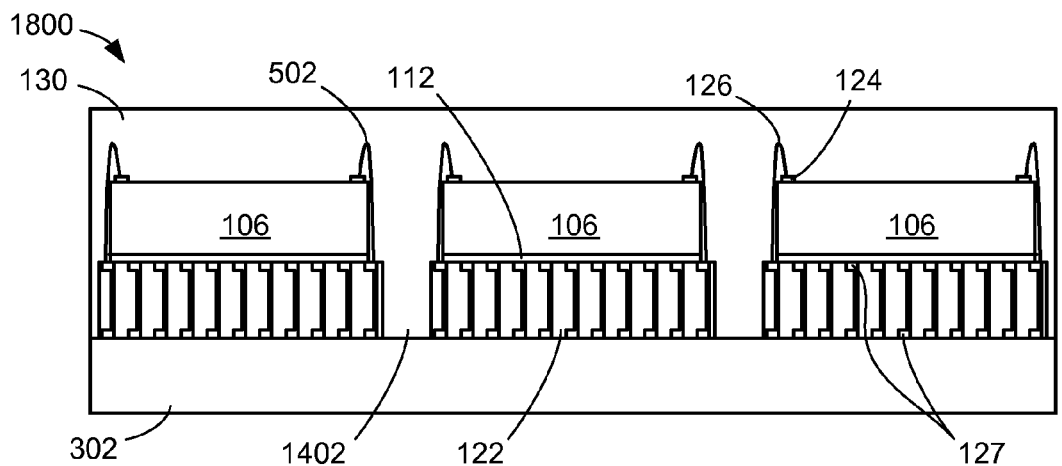
FIG. 18 is a cross-sectional view similar to FIG. 1 of an unfinished semiconductor package of the first embodiment of the present invention after a sixth alternative intermediate stage of the process.

Referring now to FIG. 18, therein is shown a cross-sectional view similar to FIG. 1 of an unfinished semiconductor package 1800 of the first embodiment of the present invention after a sixth alternative intermediate stage of the process. The top semiconductor die 106, the through silicon via interposer 122, the top bonding wire 126, the top bonding pad 124, and the die paste layer 112 are encapsulated by the top die mold 130. The through silicon via interposer groove 1402 is also filled with the top die mold 130.

Figure 19:
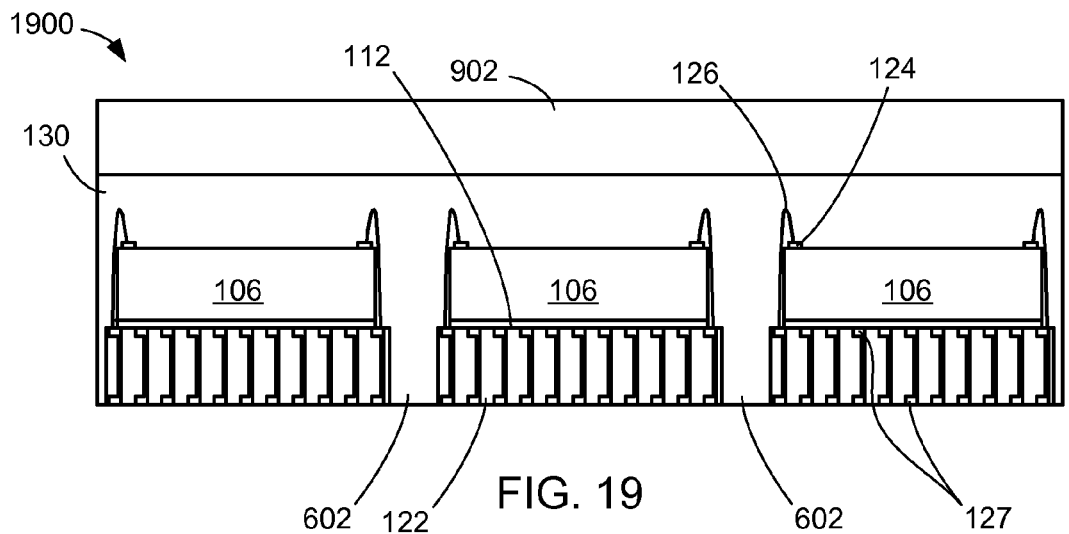
FIG. 19 is a cross-sectional view similar to FIG. 1 of an unfinished semiconductor package of the first embodiment of the present invention after a seventh alternative intermediate stage of the process.

Referring now to FIG. 19, therein is shown a cross-sectional view similar to FIG. 1 of an unfinished semiconductor package 1900 of the first embodiment of the present invention after a seventh alternative intermediate stage of the process. The bottom carrier 302 is removed. The top carrier 902 is attached to the top of the top die mold 130.

Figure 20:
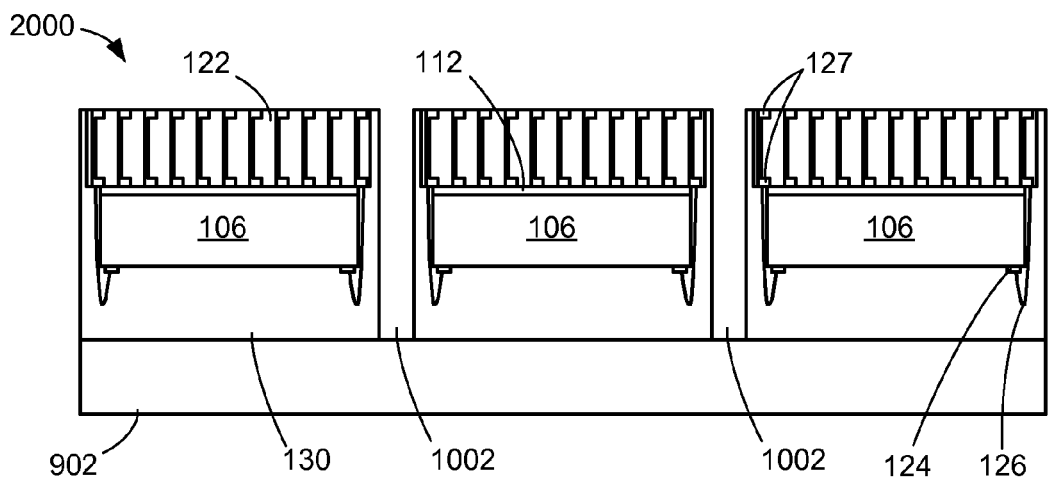
FIG. 20 is a cross-sectional view similar to FIG. 1 of an unfinished semiconductor package of the first embodiment of the present invention after an eighth alternative intermediate stage of the process.

Referring now to FIG. 20, therein is shown a cross-sectional view similar to FIG. 1 of an unfinished semiconductor package 2000 of the first embodiment of the present invention after an eighth intermediate stage of the process. The unfinished semiconductor package 1900 in FIG. 19 is singulated and the top gap 1002 is formed. The FIG. 20 is in an upside down view compared to FIG. 19.

Figure 21:
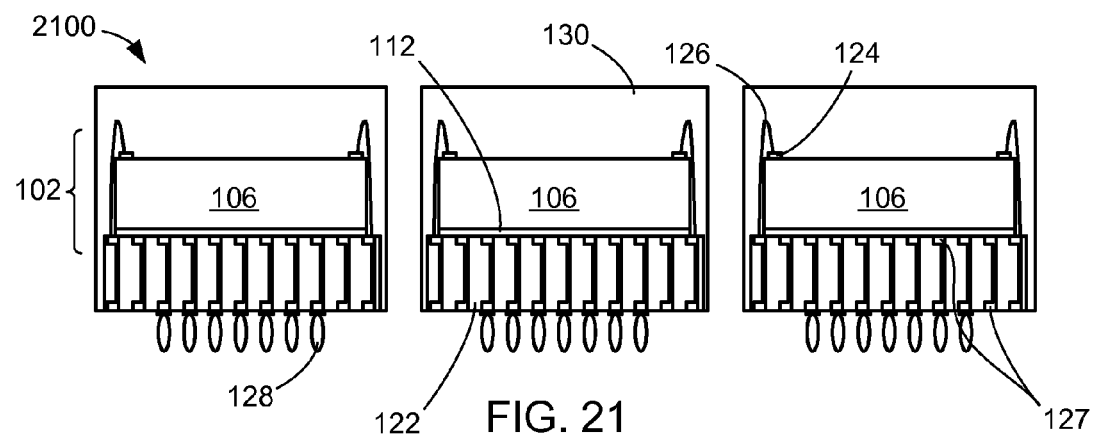
FIG. 21 is a cross-sectional view similar to FIG. 1 of an unfinished semiconductor package of the first embodiment of the present invention after a ninth alternative intermediate stage of the process.

Referring now to FIG. 21, therein is shown a cross-sectional view similar to FIG. 1 of an unfinished semiconductor package 2100 of the first embodiment of the present invention after a ninth intermediate stage of the process. The top carrier 902 is removed. The top on-chip solder ball 128 is attached to through silicon via interposer pad 127 at the bottom of the through silicon via interposer 122. The top package 102 is formed.

Figure 22:
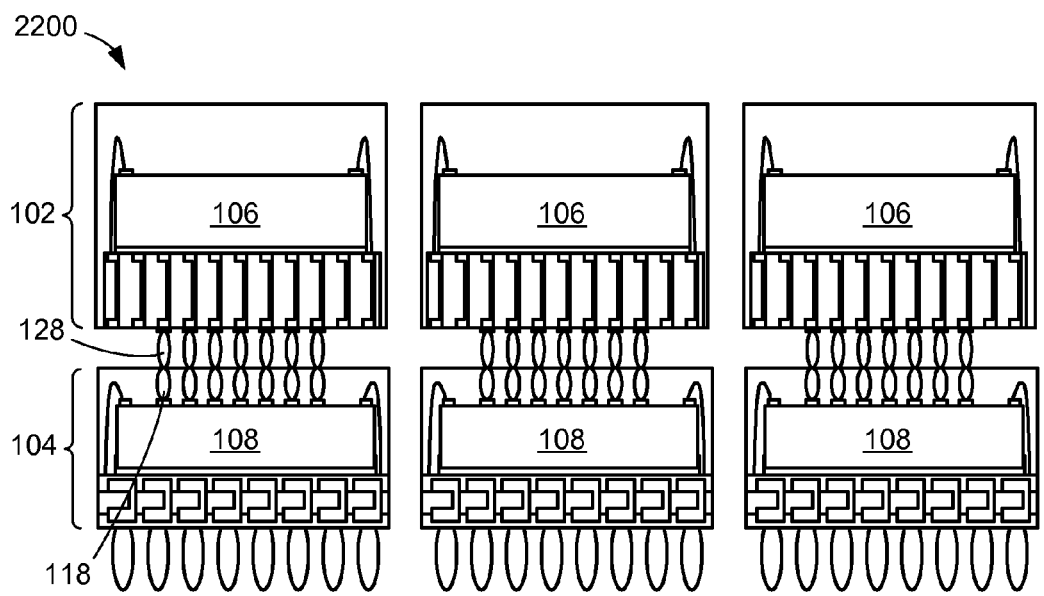
FIG. 22 is a cross-sectional view similar to FIG. 1 of a finished semiconductor package of the first embodiment of the present invention after a tenth alternative intermediate stage of the process.

Referring now to FIG. 22, therein is shown a cross-sectional view similar to FIG. 1 of a finished semiconductor package 2200 of the first embodiment of the present invention after a tenth intermediate stage of the process. The top package 102 is connected with the bottom package 104 through the contact between the top on-chip solder ball 128 and the bottom on-chip solder ball 118. The finished semiconductor package 2200 is formed.

Figure 23:
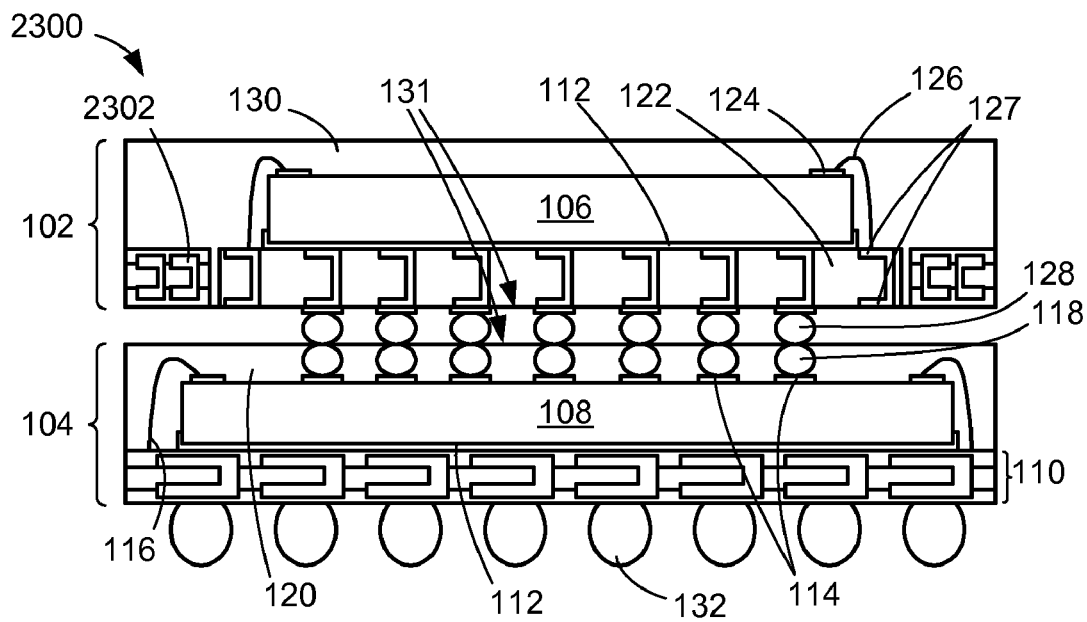
FIG. 23 is a cross-sectional view similar to FIG. 1 of a semiconductor package of a second embodiment of the present invention after a stage of singulation.

Referring now to FIG. 23, therein is shown a cross-sectional view similar to FIG. 1 of a semiconductor package of a second embodiment of the present invention after a stage of singulation. A finished semiconductor package 2300 is shown. The finished semiconductor package 2300 is a Package-on-Package package (PoP). The finished semiconductor package 2300 has the top package 102 and the bottom package 104. The top semiconductor die 106 is embedded in the top package 102. The bottom semiconductor die 108 is embedded in the bottom package 104.

The bottom semiconductor die 108 is attached to the substrate interposer 110 through the die paste layer 112. The substrate interposer may be a laminated substrate. The bottom bonding pad 114 is shown on the bottom semiconductor die 108. The bottom bonding pad 114 is present on both the active center face as well as the periphery of the bottom semiconductor die 108. One bottom bonding pad 114 is attached to one end of the bottom bonding wire 116. The other end of the bottom bonding wire 116 is attached to the substrate interposer 110. The bottom on-chip solder ball 118 is attached to one bottom bonding pad 114 that is on or near the active center face of the bottom semiconductor die 108. The bottom semiconductor die 108, the bottom bonding wire 116, the bottom bonding pad 114, the die paste layer 112, and the whole or a portion of the bottom on-chip solder ball 118 are encapsulated by the bottom die mold 120.

The top semiconductor die 106 is attached to the through silicon via interposer 122 through the die paste layer 112.

The through silicon via interposer 122 is a silicon wafer or die that has electrical metal traces on one or both sides connected by conductive metal vias through the silicon.

It has been discovered that a conductive metal via may be placed at the center of the through silicon via interposer 122 as well as at the edges, and it has been found that by using the through silicon via interposer 122, the package size may be decreased without increasing the thickness and the packing density increased, resulting in packing a greater amount of functionality into a smaller size.

In addition, critical electrical paths through the through silicon via interposer 122 can be drastically shortened, leading to faster operation, higher data transmission bandwidth, less heating, lower power consumption, and significant performance enhancement.

A top substrate interposer 2302 is also embedded in the top package 102.

The top bonding pad 124 is shown on the top semiconductor die 106. The top bonding pad 124 is attached to one end of the top bonding wire 126. The other end of the top bonding wire 126 is attached to the through silicon via interposer pad 127 on the through silicon via interposer 122.

The through silicon via interposer pad 127 is at both the top and the bottom surface of the through silicon via interposer 122. The through silicon via interposer pad 127 is at both the center and the peripheral surface of the through silicon via interposer 122.

The top on-chip solder ball 128 is attached to one through silicon via interposer pad 127 at or near the center of the bottom surface of the through silicon via interposer 122. The top semiconductor die 106, the top bonding wire 126, the top bonding pad 124, the die paste layer 112, and the through silicon via interposer 122 are encapsulated by the top die mold 130.

The top on-chip solder ball 128 is in contact with the bottom on-chip solder ball 118. In this way, the top package 102 and the bottom package 104 is connected through the center active face 131 respective of the top package 102 and the bottom package 104, rather through the peripheries, resulting in denser packaging. The connection of the bottom on-chip ball 118 is exposed from the bottom die mold 120.

The package solder ball 132 is attached to the bottom of the substrate interposer 110 of the bottom package 104. The top die mold 130 and the bottom die mold 120 could be made out of organic materials.

Figure 24:
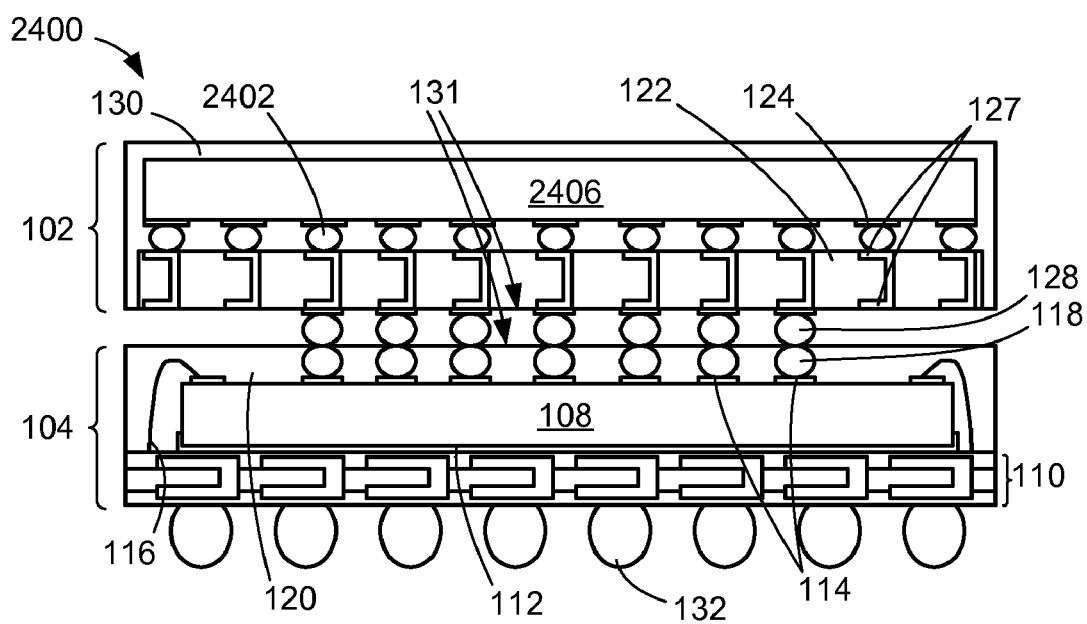
FIG. 24 is a cross-sectional view similar to FIG. 1 of a semiconductor package of a third embodiment of the present invention after a stage of singulation.

Referring now to FIG. 24, therein is shown a cross-sectional view similar to FIG. 1 of a semiconductor package of a third embodiment of the present invention after a stage of singulation. A finished semiconductor package 2400 is shown. The finished semiconductor package 2400 is a Package-on-Package package (PoP). The finished semiconductor package 2400 has the top package 102 and the bottom package 104. A top semiconductor flip chip die 2406 is embedded in the top package 102. The bottom semiconductor die 108 is embedded in the bottom package 104.

The bottom semiconductor die 108 is attached to the substrate interposer 110 through the die paste layer 112. The substrate interposer may be a laminated substrate. The bottom bonding pad 114 is shown on the bottom semiconductor die 108. The bottom bonding pad 114 is present on both the active center face as well as the periphery of the bottom semiconductor die 108. One bottom bonding pad 114 is attached to one end of the bottom bonding wire 116. The other end of the bottom bonding wire 116 is attached to the substrate interposer 110. The bottom on-chip solder ball 118 is attached to one bottom bonding pad 114 that is on or near the active center face of the bottom semiconductor die 108. The bottom semiconductor die 108, the bottom bonding wire 116, the bottom bonding pad 114, the die paste layer 112, and the whole or a portion of the bottom on-chip solder ball 118 are encapsulated by the bottom die mold 120.

The top bonding pad 124 is shown on the top semiconductor flip chip die 2406. In the current embodiment of the present invention, the top bonding pad 124 is at both the active center face and the periphery of the bottom surface of the flip chip die 2406. The top bonding pad 124 is attached to a flip chip solder ball 2402.

The through silicon via interposer pad 127 is at both the top and the bottom surface of the through silicon via interposer 122. The through silicon via interposer pad 127 is at both the center and the peripheral surface of the through silicon via interposer 122.

The through silicon via interposer 122 is a silicon wafer or die that has electrical metal traces on one or both sides connected by conductive metal vias through the silicon.

It has been discovered that a conductive metal via may be placed at the center of the through silicon via interposer 122 as well as at the edges, and it has been found that by using the through silicon via interposer 122, the package size may be decreased without increasing the thickness and the packing density increased, resulting in packing a greater amount of functionality into a smaller size.

In addition, critical electrical paths through the through silicon via interposer 122 can be drastically shortened, leading to faster operation, higher data transmission bandwidth, less heating, lower power consumption, and significant performance enhancement.

The flip chip solder ball 2402 is attached to the through silicon via interposer pad 127 at the top of the through silicon via interposer 122. The top on-chip solder ball 128 is attached to the through silicon via interposer pad 127 at the bottom of the through silicon via interposer 122. The top semiconductor flip chip die 2406, the top bonding pad 124, the flip chip solder ball 2402, and the through silicon via interposer 122 are encapsulated by the top die mold 130.

The top on-chip solder ball 128 is in contact with the bottom on-chip solder ball 118. In this way, the top package 102 and the bottom package 104 is connected through the center active face 131 respective of the top package 102 and the bottom package 104, rather through the peripheries, resulting in denser packaging.

The package solder ball 132 is attached to the bottom of the substrate interposer 110 of the bottom package 104. The top die mold 130 and the bottom die mold 120 could be made out of organic materials.

The current embodiment of the present invention also facilitates stacking of various semiconductor chips such as the flip chip die 2406.

Figure 25:
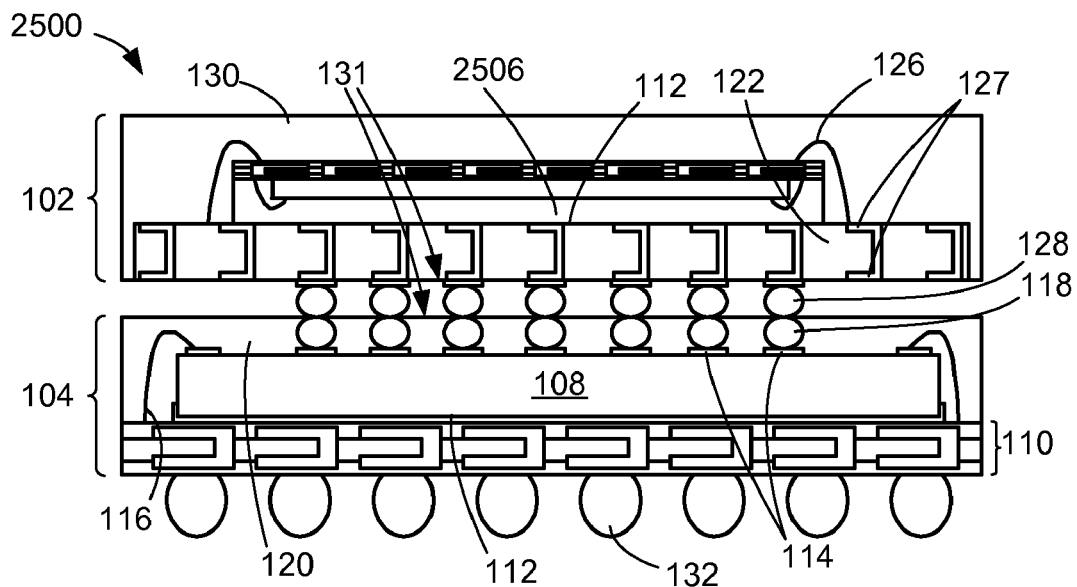
FIG. 25 is a cross-sectional view similar to FIG. 1 of a semiconductor package of a fourth embodiment of the present invention after a stage of singulation.

Referring now to FIG. 25, therein is shown a cross-sectional view similar to FIG. 1 of a semiconductor package of a fourth embodiment of the present invention after a stage of singulation. A finished semiconductor package 2500 is shown. The semiconductor package 2500 is a Package-on-Package package (PoP). The semiconductor package 2500 has the top package 102 and the bottom package 104. A top internal stacking module 2506 is embedded in the top package 102. The bottom semiconductor die 108 is embedded in the bottom package 104.

The bottom semiconductor die 108 is attached to the substrate interposer 110 through the die paste layer 112. The substrate interposer may be a laminated substrate. The bottom bonding pad 114 is shown on the bottom semiconductor die 108. The bottom bonding pad 114 is present on both the active center face as well as the periphery of the bottom semiconductor die 108. One bottom bonding pad 114 is attached to one end of the bottom bonding wire 116. The other end of the bottom bonding wire 116 is attached to the substrate interposer 110. The bottom on-chip solder ball 118 is attached to one bottom bonding pad 114 that is on or near the active center face of the bottom semiconductor die 108. The bottom semiconductor die 108, the bottom bonding wire 116, the bottom bonding pad 114, the die paste layer 112, and the whole or a portion of the bottom on-chip solder ball 118 are encapsulated by the bottom die mold 120.

The top internal stacking module 2506 is attached to the through silicon via interposer 122 through the die paste layer 112.

The through silicon via interposer 122 is a silicon wafer or die that has electrical metal traces on one or both sides connected by conductive metal vias through the silicon.

It has been discovered that a conductive metal via may be placed at the center of the through silicon via interposer 122 as well as at the edges, and it has been found that by using the through silicon via interposer 122, the package size may be decreased without increasing the thickness and the packing density increased, resulting in packing a greater amount of functionality into a smaller size.

In addition, critical electrical paths through the through silicon via interposer 122 can be drastically shortened, leading to faster operation, higher data transmission bandwidth, less heating, lower power consumption, and significant performance enhancement.

The through silicon via interposer pad 127 is at both the top and the bottom surface of the through silicon via interposer 122. The through silicon via interposer pad 127 is at both the center and the peripheral surface of the through silicon via interposer 122.

One end of the top bonding wire 126 is attached to the bottom of the top internal stacking module 2506. The other end of the top bonding wire 126 is attached to the through silicon via interposer pad 127 on the top of the through silicon via interposer 122.

The top on-chip solder ball 128 is attached to the through silicon via interposer pad 127 at the bottom of the through silicon via interposer 122. The top internal stacking module 2506, the top bonding wire 126, the die paste layer 112, and the through silicon via interposer 122 are encapsulated by the top die mold 130.

The top on-chip solder ball 128 is in contact with the bottom on-chip solder ball 118. In this way, the top package 102 and the bottom package 104 is connected through the center active face 131 respective of the top package 102 and the bottom package 104, rather through the peripheries, resulting in denser packaging.

The package solder ball 132 is attached to the bottom of the substrate interposer 110 of the bottom package 104. The top die mold 130 and the bottom die mold 120 could be made out of organic materials.

The current embodiment of the present invention also facilitates stacking of various semiconductor chips such as the top internal stacking module 2506.

Figure 26:
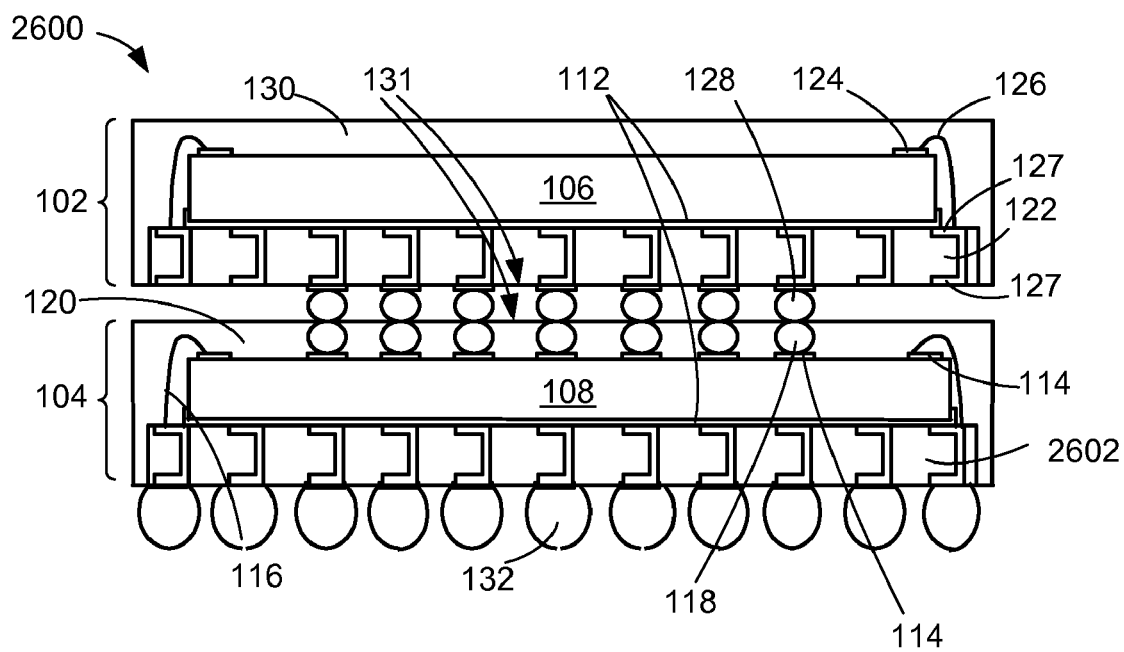
FIG. 26 is a cross-sectional view similar to FIG. 1 of a semiconductor package of a fifth embodiment of the present invention after a stage of singulation.

Referring now to FIG. 26, therein is shown a cross-sectional view similar to FIG. 1 of a semiconductor package of a fifth embodiment of the present invention after a stage of singulation. A finished semiconductor package 2600 is shown. The finished semiconductor package 2600 is a Package-on-Package package (PoP). The semiconductor package 2600 has the top package 102 and the bottom package 104. The top semiconductor die 106 is embedded in the top package 102. The bottom semiconductor die 108 is embedded in the bottom package 104.

The bottom semiconductor die 108 is attached to a bottom through silicon via interposer 2602 through the die paste layer 112. The bottom bonding pad 114 is shown on the bottom semiconductor die 108. The bottom bonding pad 114 is present on both the active center face as well as the periphery of the bottom semiconductor die 108. One bottom bonding pad 114 is attached to one end of the bottom bonding wire 116. The other end of the bottom bonding wire 116 is attached to the bottom through silicon via interposer 2602. The bottom on-chip solder ball 118 is attached to one bottom bonding pad 114 that is on or near the active center face of the bottom semiconductor die 108. The bottom semiconductor die 108, the bottom bonding wire 116, the bottom bonding pad 114, the die paste layer 112, the bottom through silicon via interposer 2602, and the whole or a portion of the bottom on-chip solder ball 118 are encapsulated by the bottom die mold 120.

The top semiconductor die 106 is attached to the through silicon via interposer 122 through the die paste layer 112.

The through silicon via interposer 122 or the bottom through silicon via interposer 2602 is a silicon wafer or die that has electrical metal traces on one or both sides connected by conductive metal vias through the silicon.

It has been discovered that a conductive metal via may be placed at the center of the through silicon via interposer 122 as well as at the edges, and it has been found that by using the through silicon via interposer 122, the package size may be decreased without increasing the thickness and the packing density increased, resulting in packing a greater amount of functionality into a smaller size.

In addition, critical electrical paths through the through silicon via interposer 122 can be drastically shortened, leading to faster operation, higher data transmission bandwidth, less heating, lower power consumption, and significant performance enhancement.

The top bonding pad 124 is shown on the top semiconductor die 106. The top bonding pad 124 is attached to one end of the top bonding wire 126. The other end of the top bonding wire 126 is attached to the through silicon via interposer pad 127 on the through silicon via interposer 122.

The through silicon via interposer pad 127 is at both the top and the bottom surface of the through silicon via interposer 122. The through silicon via interposer pad 127 is at both the center and the peripheral surfaces of the through silicon via interposer 122.

The top on-chip solder ball 128 is attached to one through silicon via interposer pad 127 at or near the center of the bottom surface of the through silicon via interposer 122. The top semiconductor die 106, the top bonding wire 126, the top bonding pad 124, the die paste layer 112, and the through silicon via interposer 122 are encapsulated by a top die mold 130.

The top on-chip solder ball 128 is in contact with the bottom on-chip solder ball 118. In this way, the top package 102 and the bottom package 104 is connected through a center active face 131 respective of the top package 102 and the bottom package 104, rather through the peripheries, resulting in denser packaging.

The package solder ball 132 is attached to the bottom of the bottom through silicon via interposer 2602 of the bottom package 104. The top die mold 130 and the bottom die mold 120 could be made out of organic materials.

Figure 27:
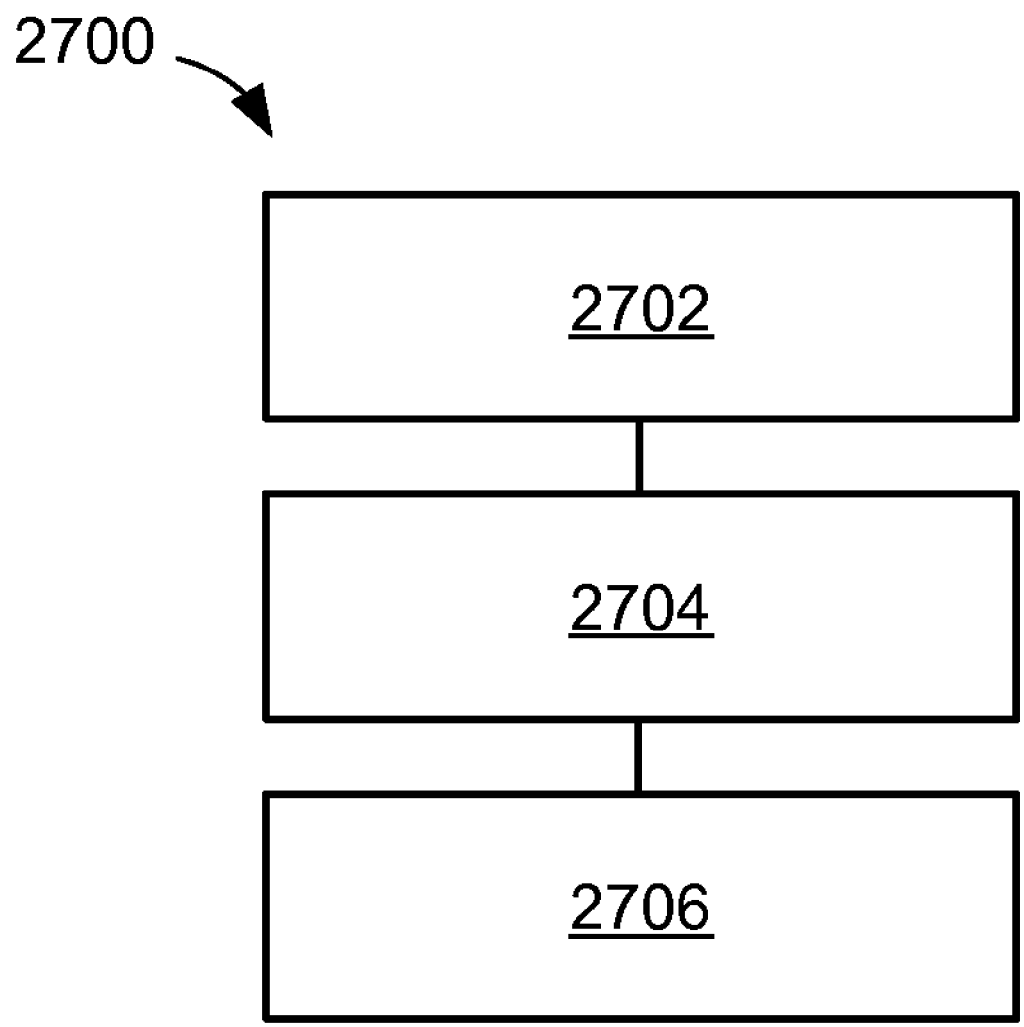
FIG. 27 is a flow chart of a semiconductor package system for manufacturing the semiconductor package system in an embodiment of the present invention.

Referring now to FIG. 27, therein is shown a flow chart of a semiconductor package system 2700 for manufacturing the semiconductor package system 100 in an embodiment of the present invention. The semiconductor package system 2700 includes providing a top package, a through silicon via interposer embedded in the top package in a block 2702; providing a bottom package having a bottom semiconductor die with a top connection adjacent the center active face thereof, a substrate interposer being embedded in the bottom package, the bottom semiconductor die being attached to the substrate interposer in a block 2704; and attaching the top package to the bottom package, the top package having the through silicon via interposer having a via connected to the top connection in a block 2706.

It is discovered that the present invention reduces total package size due to not using solder ball interconnection at the periphery of the conventional Package-on-Package package, reduces package thickness due to using the through silicon via interposer instead of the substrate interposer in the conventional Package-on-Package package, and increases packing density resulting in stacking more live dies in the same space as conventional PoP structure. It is also discovered that the present invention may accommodate various Package-on-Package package, flip chip, internal stacking modules, fan-in Package-on-Package structures, including semiconductor chips designed both for and not for 3D interconnections. In addition, it is further discovered that critical electrical paths through the device can be drastically shortened, leading to faster operation, higher data transmission bandwidth, less heating, lower power consumption, and significant performance enhancement.

Yet another important aspect of the present invention is that it valuably supports and services the historical trend of reducing manufacturing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, reducing complexity, and reducing cost of integrated circuit system. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit package system fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a semiconductor package system comprising:

providing a top package, a through silicon via interposer embedded in the top package;

providing a bottom package having a bottom semiconductor die with a top connection adjacent a center active face thereof, a bottom die mold with the top connection exposed from the bottom die mold, a substrate interposer being embedded in the bottom package, the bottom semiconductor die being attached to the substrate interposer; and attaching the top package to the bottom package, the top package having the through silicon via interposer having a via connected to the top connection wherein providing the top package includes providing the top package with a top semiconductor die and a top substrate interposer embedded in the top package, the top semiconductor die being attached to the through silicon via interposer.

2. The method as claimed in claim 1 wherein providing the top package includes providing the top package with a top semiconductor die embedded in the top package, the top semiconductor die being attached to the through silicon via interposer.

3. The method as claimed in claim 1 wherein providing the top package includes providing the top package with a top semiconductor flip chip die embedded in the top package, the top semiconductor flip chip die being attached to the through silicon via interposer.

4. The method as claimed in claim 1 wherein providing the top package includes providing the top package with a top internal stacking module embedded in the top package, the top internal stacking module being attached to the through silicon via interposer.

5. A method of manufacturing a semiconductor package system comprising:

forming units of a top semiconductor die attached to a through silicon via interposer on a bottom carrier, each unit being separated from each other;

encapsulating the units of the top semiconductor die attached to the through silicon via interposer with a top die mold;

attaching a top on-chip solder ball to the through silicon via interposer, the top on-chip solder ball is at a center face of the through silicon via interposer, top package being thus formed; and connecting the top package to a bottom package at a center active face of the top package and the bottom package, a bottom die mold with the top connection exposed from the bottom die mold, wherein providing the top package includes providing the top package with a top semiconductor die and a top substrate interposer embedded in the top package, the top semiconductor die being attached to the through silicon via interposer.

6. The method as claimed in claim 5 wherein forming units of the top semiconductor die attached to the through silicon via interposer on the bottom carrier includes:

attaching the top semiconductor die to the through silicon via interposer through a die paste layer, a top bonding pad being on the top semiconductor die;

attaching one end of a top bonding wire to the top bonding pad and the other end of the top bonding wire to a through silicon via interposer pad on the through silicon via interposer;

attaching a wire lock layer to the top bonding wire, the bonding wire being wrapped around by the wire lock layer; and sawing the through silicon via interposer to form a top groove, each unit of the top semiconductor die attached to the through silicon via interposer being thus separated from each other.

7. The method as claimed in claim 5 wherein forming units of the top semiconductor die attached to the through silicon via interposer on the bottom carrier includes:

sawing the through silicon via interposer to form a through silicon via interposer groove;

attaching the top semiconductor die to the through silicon via interposer through a die paste layer, a top bonding pad being on the top semiconductor die; and attaching one end of a top bonding wire to the top bonding pad and the other end of the top bonding wire to the through silicon via interposer pad on the through silicon via interposer, each unit of the top semiconductor die attached to the through silicon via interposer being separate from each other.

8. The method as claimed in claim 5 wherein attaching the top package to the bottom package includes attaching the top on-chip solder ball of the top package to a bottom on-chip solder ball of the bottom package.

9. The method as claimed in claim 5 wherein connecting the top package to the bottom package at the center active face of the top package and the bottom package includes connecting the top package to the bottom package having a bottom semiconductor die with a top connection adjacent the center active face thereof, a bottom through silicon via interposer being embedded in the bottom package, the bottom semiconductor die being attached to the bottom through silicon via interposer.

10. A semiconductor package system comprising:

a top package, a through silicon via interposer embedded in the top package; and a bottom package having a bottom semiconductor die with a top connection adjacent a center active face thereof, a substrate interposer being embedded in the bottom package, the bottom semiconductor die being attached to the substrate interposer, a bottom die mold with the top connection exposed from the bottom die mold, the top package being attached to the bottom package, the top package having the through silicon via interposer having a via connected to the top connection wherein the top package has a top semiconductor die and a top substrate interposer embedded in the top package, the top semiconductor die being attached to the through silicon via interposer.

11. The system as claimed in claim 10 wherein the top package has a top semiconductor die embedded in the top package, the top semiconductor die being attached to the through silicon via interposer.

12. The system as claimed in claim 10 wherein the top package has a top semiconductor flip chip die embedded in the top package, the top semiconductor flip chip die being attached to the through silicon via interposer.

13. The system as claimed in claim 10 wherein the top package has a top internal stacking module embedded in the top package, the top internal stacking module being attached to the through silicon via interposer.

14. The system as claimed in claim 10 wherein:
the top package has a top semiconductor die embedded in the top package, the top semiconductor die being attached to the through silicon via interposer; and further comprising:
a package solder ball attached to the substrate interposer of the bottom package.

15. The system as claimed in claim 14 wherein the bottom package is attached to the top package through a contact between a top on-chip solder ball and a bottom on-chip solder ball.

16. The system as claimed in claim 14 wherein the top package includes a top semiconductor die having a top bonding pad on a top semiconductor die and a top bonding wire, one end of the top bonding wire being attached to the top bonding pad and the other end of the top bonding wire being attached to a through silicon via interposer pad on the through silicon via interposer.

17. The system as claimed in claim 14 wherein the top package includes a top semiconductor die having a top bonding pad on the top semiconductor die and a top bonding wire, the top bonding wire being wrapped around with a wire lock layer, one end of the top bonding wire being attached to the top bonding pad and the other end of the top bonding wire being attached to a through silicon via interposer pad on the through silicon via interposer.

18. The system as claimed in claim 14 wherein the top package includes a top semiconductor die is attached to the through silicon via interposer through a die paste layer.

* * * * *

UNITED STATES PATENT AND TRADEMARK OFFICE
CERTIFICATE OF CORRECTION

Page 1 of 1

PATENT NO. : 8,063,475 B2
APPLICATION NO. : 12/239715
DATED : November 22, 2011
INVENTOR(S) : Choi et al.

Figure 11:
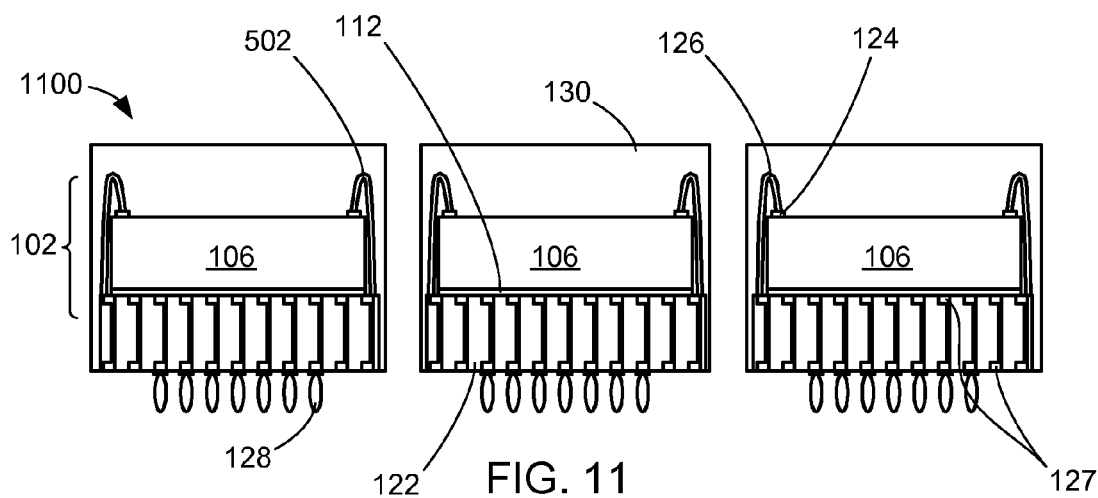
FIG. 11 is a cross-sectional view similar to FIG. 1 of an unfinished semiconductor package of the first embodiment of the present invention after a ninth intermediate stage of the process.

It is certified that error appears in the above-identified patent and that said Letters Patent is hereby corrected as shown below:

In the Specification:

Column 6, line 52, delete "Referring now to FIG. 1, therein" and insert therefor -- Referring now to FIG. 11, therein --

Signed and Sealed this
First Day of April, 2014

Michelle K. Lee
*Deputy Director of the United States Patent and Trademark Office*